United States Patent
Bhateja et al.

(10) Patent No.: US 6,483,291 B1
(45) Date of Patent: Nov. 19, 2002

(54) APPARATUS FOR MEASURING ELECTRICAL POWER CONSUMPTION

(76) Inventors: Chander P. Bhateja, 17 Presidential Dr., Oak Ridge, TN (US) 37830; Rajiv K. Bhateja, 17 Presidential Dr., Oak Ridge, TN (US) 37830

(*) Notice: Subject to any disclaimer, the term of this patent is extended or adjusted under 35 U.S.C. 154(b) by 0 days.

(21) Appl. No.: 09/579,687

(22) Filed: May 26, 2000

(51) Int. Cl.[7] .......................... G01R 7/00; G01R 19/00; G01R 11/32
(52) U.S. Cl. .......................... 324/142; 324/107; 324/74
(58) Field of Search ............................... 324/142, 107, 324/74, 117 R

(56) References Cited

U.S. PATENT DOCUMENTS

| | | | | |
|---|---|---|---|---|
| 4,300,182 A | * | 11/1981 | Schweitzer, III | 324/141 |
| 4,535,287 A | * | 8/1985 | Milkovic | 324/142 |
| 4,700,188 A | * | 10/1987 | James | 324/110 |
| 4,764,720 A | * | 8/1988 | Nystrom | 324/142 |
| 4,884,021 A | * | 11/1989 | Hammond et al. | 324/142 |
| 5,003,252 A | * | 3/1991 | Nystrom | 324/142 |
| 5,122,735 A | * | 6/1992 | Porter et al. | 324/142 |
| 5,319,300 A | * | 6/1994 | Wood | 324/142 |
| 5,352,962 A | * | 10/1994 | Balburt | 318/687 |
| 5,414,349 A | * | 5/1995 | Kobayashi | 324/142 |
| 5,438,258 A | * | 8/1995 | Maruyama | 324/142 |
| 5,467,012 A | * | 11/1995 | Nystrom | 324/142 |
| 5,475,303 A | * | 12/1995 | Kobayashi | 324/142 |
| 5,485,393 A | * | 1/1996 | Bradford | 324/142 |
| 5,537,029 A | * | 7/1996 | Hemminger et al. | 324/142 |

* cited by examiner

*Primary Examiner*—Michael Sherry
*Assistant Examiner*—Jermele Hollington
(74) *Attorney, Agent, or Firm*—Pitts & Brittian, P.C.

(57) ABSTRACT

An apparatus for measuring electrical power consumption. An apparatus for measuring electrical power consumption is provided. The total power is obtained by multiplying the instantaneous voltage of the load by the instantaneous current of the load and summing the results of multiple phases. The total power voltage is calibrated to the full scale of the power meter for display to the operator. The power meter digitally displays the output in operator selectable measurement units and on a rapid response bar graph representing the proportion of full scale. Additionally, the power meter provides a current output and both scaled and unscaled voltage outputs representing the total power consumption, high and low trip settings, a peak power hold feature, and a scaling feature to allow precise measurements at for power levels less than the full scale rating of the power meter. Finally, the power meter can be connected to external devices for monitoring or control.

34 Claims, 2 Drawing Sheets

APPARATUS FOR MEASURING ELECTRICAL POWER CONSUMPTION

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

1. Field of Invention

This invention relates to an apparatus for measuring the power consumption of an electricity powered device or machine. More specifically, this invention relates to an apparatus which measures the power consumption by calculating the wattage consumed by the electrical device from the measured voltage and current.

2. Description of the Related Art

The power consumed by any process is an important parameter useful for optimizing a process. For example, in grinding, the power consumed is indicative of the efficiency of a grinding wheel to remove material in a given operation. Thus, between two grinding wheels removing material at a certain rate under identical grinding conditions, the grinding wheel consuming less power is more efficient. Accordingly, it is desirable to measure the power consumed by a given machine.

Efficiency may also be calculated based upon the current draw of the load; however, the current draw is typically nonlinear for an inductive motor load wherein the power is a multiple of the voltage, the current, and a "power factor" which is the cosine of the lag angle between the voltage and the current. The power factor varies depending upon the load. For example, an AC motor at idle may have a typical power factor of approximately 0.1 while the power factor of same motor at full load may be approximately 0.8. Measurement of the power consumed by an electrical load containing resistance, capacitance, and inductance requires the measurement of the actual values of the voltage, the current, and the phase angle representing the lag angle between the voltage and the current.

Other devices have been developed to calculate the power consumption by measuring the voltage and the current. Typical are those devices disclosed in the following United States Patents:

| U.S. Pat. No. | Inventor | Issue Date |
| --- | --- | --- |
| 5,537,029 | Hemminger, R. C., et al. | Jul. 16, 1996 |
| 5,475,303 | Kobayashi, S. | Dec. 12, 1995 |
| 5,467,012 | Nystrom, R. W. | Nov. 14, 1995 |
| 5,438,258 | Maruyama, R. | Aug. 1, 1995 |
| 5,414,349 | Kobayashi, S. | May 9, 1995 |
| 5,003,252 | Nystrom, R. W. | Mar. 26, 1991 |
| 4,764,720 | Nystrom, R. W. | Aug. 16, 1988 |
| 4,535,287 | Milkovic, M. | Aug. 13, 1985 |

Typically in the inventions disclosed in the aforementioned patents, the power consumption is calculated by the Hall device which senses the magnetic field created in a current carrying line by the Hall Effect and multiples it by the line voltage, e.g., U.S. Pat. No. 5,438,258, issued to Maruyama and U.S. Pat. No. 4,764,720 issued to Nystrom. The prior art sensors based on the Hall device are essentially limited to lower frequency applications. The power calculated using a typical Hall device is limited by the frequency response of such a device and typically loses significant accuracy at frequencies above 1000 Hz. U.S. Pat. No. 5,537,029, issued to Hemminger et al., teaches a sophisticated microprocessor-based system having elaborate software for monitoring power consumption and, more important, testing the operation of the power meter. The present invention is capable of accurate measurements at frequencies above the 1000 Hz mark by using a Hall sensor only to obtain a voltage proportional to the current and independently obtaining and attenuating the input voltage. The input-current voltage and the input voltage are multiplied and summed to calculate the total power consumption using simple, discrete components.

Additionally, the prior art devices typically require a complex setup procedure requiring the operator to select both the maximum input current and the maximum input voltage. The present invention reduces the need for additional settings requiring the operator to simply select the desired output range of the power meter.

Finally, the prior art devices are limited in the customization and information available to the operator. The devices are typically intended for self-contained use. For example, when using a portable power meter which is not associated with a single machine, it is desirable to be able to adjust the scale of the output to read the power consumption with some precision. Further, prior art devices typically provide instantaneous power consumption readings using an analog display which suffers from a slow response time and hides small effects from the operator. Additionally, the prior art meters, particularly those with analog displays, do not provide the operator with important information such as peak power. Prior art devices incorporating digital displays have not been taught having differing measurement units available to the operator. While the analog displays may have multiple scales, the analog devices typically only provide an approximation of the total power consumption subject to the operator's interpretation of the needle position. The present invention provides an unscaled output along with an operator selectable scaled output allowing more precise measurement of power consumption significantly less than the full scale maximum of the power meter in addition to a default range, full scale output. Additionally, the present invention utilizes a bar LED display for rapid response when displaying the instantaneous power usage and a digital display with user selectable measurement units to provide accurate, non-discretionary power consumption readings coupled with a peak power hold feature. Finally, the power meter of the present invention, while self contained, provides for intelligent communication with external devices.

Accordingly, there is a need for a power meter which does not require setting of the maximum input current and the maximum input voltage prior to making a measurement. Additionally, there is a need for a power meter which is capable of measuring the power consumption of a load requiring a high frequency power supply without degradation of the measurement accuracy. There is also a need for a power meter providing a fast responding display of instantaneous power consumption, a display of peak power consumption, and providing operator selectable measurement units. Further, there is a need for a power meter providing both scaled and unscaled outputs for external monitoring of the system and providing both high and low trip points. Finally, there is a need for a power meter capable of communicating with and responding to external devices.

Therefore, it is an object of the present invention to provide a power meter which requires only the maximum power range to be set prior to making a measurement.

It is another object of the present invention to provide a power meter which is capable of measuring the power consumption of a load requiring a high frequency power supply without degradation of the measurement accuracy.

Yet another object of the present invention is to provide a power meter which provides a fast responding display of the instantaneous power consumption of the load.

A further object of the present invention is to provide a power meter which communicates with external devices for remote control of the power meter and remote display of the power meter settings and outputs.

A still further object of the present invention is to provide a power meter which simultaneously provides scaled and unscaled output signals.

An additional object of the present invention is to provide a power meter which can store and display the peak power consumption of the load.

Another object of the present invention is to provide a power meter having both high and low trip points in a single unit.

Yet another object of the present invention is to provide a power meter which is capable of scaling the output to a unit of measure selected by the operator.

BRIEF SUMMARY OF THE INVENTION

An apparatus for measuring electrical power consumption is provided. The power is measured by multiplying the instantaneous voltage of the load by the instantaneous current of the load. The current is measured using a Hall Effect current sensor. The output of the Hall current sensor is a voltage signal proportional to the measured current which is amplified to a useful level by an input current amplifier. Additionally, the input current amplifier includes a variable resistance which can be adjusted to compensate for the offset voltages added by the Hall Effect current sensor and the input current amplifier itself. A scaled down input voltage representing the instantaneous voltage of the load is obtained at an input voltage attenuation. The attenuation includes a protection circuit which protects the power meter from damage in the event that the input voltage exceeds the rated input voltage of the power meter.

The corresponding phases of input voltage and the input-current voltage are multiplied and summed to calculate the instantaneous power. The input-current voltage and the attenuated phase voltage are applied to an input of an analog multiplier. The product of the two voltages is proportional to the instantaneous power in that phase. When multiple phases are involved, the output voltages of the multipliers are summed to produce a voltage representing the total instantaneous power for all phases. A calibration amplifier adjusts the output voltage of the adder such that the output voltage is ten volts (10 V) at full scale. Next, a precision isolation amplifier isolates the adder output from the display and output portion of the power meter from the high power portion of the power meter. The output voltage of the isolation amplifier represents the total instantaneous power consumption of the attached load.

The total instantaneous power consumption voltage, or total power voltage, is used to provide the operator with information regarding the power usage of the load. The total power voltage is calibrated to the full scale of the power meter for display to the operator. The power meter provides the operator the ability to select the measurement units in which the digital representation of the total power voltage is displayed. If desired, the idle power can be subtracted from the total power. The power meter also stores and displays the peak value of the digital representation of the total power at the operator's request. A trip point detector provides monitoring of both high and low adjustable trip points along with an operator selectable time delay requiring the power to remain above or below the predetermined threshold for a predetermined period of time to prevent false triggers resulting from noise. The trip point detector includes a trip output for connecting an external warning or control device.

The output of the isolation amplifier also drives a scaling amplifier for enhancing the sensor range. The gain of the scaling amplifier is controlled by the operator adjustable range selector. The actual range is equal to the power meter full scale range divided by range factor selected using the range selector thereby allowing measurement of power at less than full scale with the desired degree of precision. The range-adjusted power is instantaneously displayed as a percentage of the range scale selected by the operator, in increments determined by the resolution of the selected LED bar display.

Various external outputs are provided to allow the power meter to interface with external devices, such as for control applications. The power meter includes both an unscaled and a scaled external voltage output and a current output for control applications. Finally, the power meter can be monitored and controlled from an external device.

An apparatus for measuring electrical power consumption has been disclosed having advantages over the prior art. The present invention does not require setting of the maximum input current and the maximum input voltage prior to making a measurement. Additionally, the present invention is capable of measuring the power consumption of a load requiring a high frequency power supply without degradation of the measurement accuracy. The power meter of the present invention provides a display of instantaneous power consumption as a percentage of the scaled measurement range. Further, the present invention provides a display of peak power consumption and operator selectable measurement units. The present invention also simultaneously provides both scaled and unscaled outputs, along with both high and low trip points. Finally, the power meter of the present invention is capable of communicating with and responding to external devices.

BRIEF DESCRIPTION OF THE SEVERAL VIEWS OF THE DRAWINGS

The above-mentioned features of the invention will become more clearly understood from the following detailed description of the invention read together with the drawings in which.

DETAILED DESCRIPTION OF THE INVENTION

An apparatus for measuring electrical power consumption, or the power meter, is illustrated generally at 10 in the figures. The power is measured by multiplying the instantaneous voltage of the load 11 by the instantaneous current of the load 11 to allow for accurate measurement of power consumption for loads 11 having a high supply line frequency. The output of the meter is displayed both as a digital representation of the full scale in measurement units selected by the operator and a proportional representation of the scaled instantaneous voltage based on an operator selectable range factor. The power meter 10 provides scaled and unscaled voltage outputs and a current output for control purposes, high and low trip signals, and a digital interface with external devices for remote control and monitoring.

Figure 1:
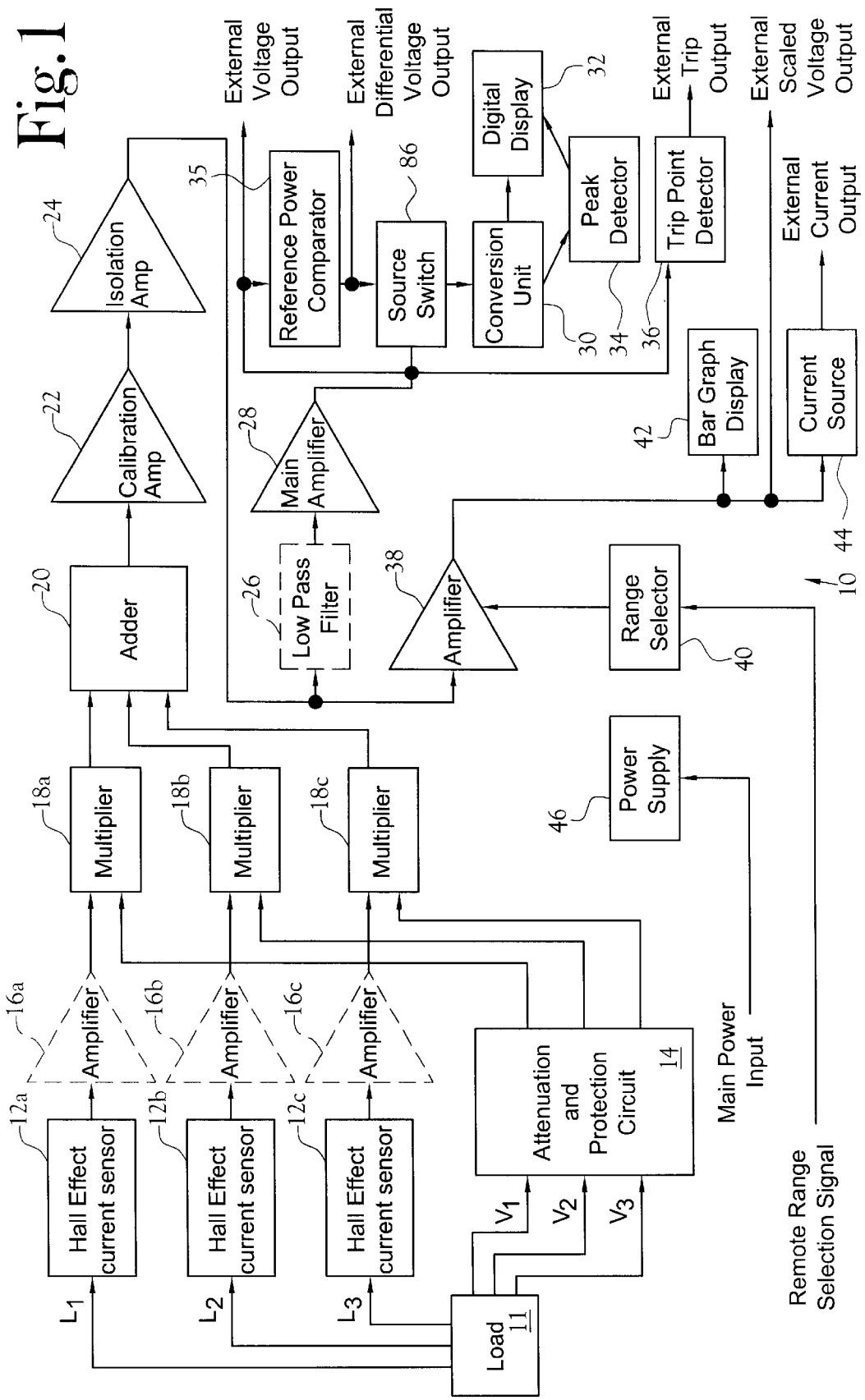
FIG. 1 is a block diagram of the power meter of the present invention.

FIG. 1 illustrates a block diagram of the power meter 10 of the present invention. The power meter 10 is powered by a universal power supply 46 which automatically adapts to supply voltage (e.g., 110V @ 60 Hz or 220V @ 50Hz) and transforms the supply voltage as necessary. The current of the load 11 is measured using a Hall Effect current sensor 12. The Hall current sensor 12 converts the magnetic field created outside a current-carrying conductor 13 into a voltage signal. The Hall Effect current sensor 12 processes the measured voltage signal and produces an output voltage signal that is directly proportional to the current flowing through the conductor 13. This allows the current to be measured indirectly without the need to break conductor 13 and insert an in-line sensor. Those skilled in the art will recognize that the electrical power consumption for a load can be measured for multiple phases by replicating the sensors for each phase. In the illustrated embodiment, the power meter 10 is configured for use with a three-phase load 11. The conductor for each phase 13a–13c is routed through a separate Hall Effect current sensor 12a–12c. Those skilled in the art will recognize that the Hall Effect current sensor 12 may be built within the power meter 10 or may be located externally and connected to the power meter 10 via a cable (not shown). Those skilled in the art will recognize that the voltage and current cables can be either permanently or removably attached to the power meter 10. Removable attachment provides additional flexibility by allowing the use of optional current probes of various current measurement and self-diagnostic capabilities. In the preferred embodiment, an optional input current amplifier 16 is included to amplify the output of the Hall Effect current sensor 12. Additionally, the input current amplifier 16 compensates for the offset voltages added by the Hall Effect current sensor 12 and the input current amplifier 16 itself. The compensation is achieved by adjusting a variable resistance. The compensated input-current voltage signal is then ready for use to calculate the power consumption of the load 11.

The instantaneous voltage of the load 11 is obtained at an input voltage attenuation circuit 14. Because the instantaneous voltage of the load 11 is typically very large compared to the input current voltage, it is necessary to reduce the input voltage proportionally to a level which can be utilized by the discrete components or integrated circuits which calculate the power. For the three-phase embodiment illustrated in FIG. 1, the attenuation circuit 14 includes a separate input for each voltage phase. The attenuation circuit 14 proportionally reduces the input phase-to-phase to a voltage level within the operating input range of a multiplier 18 connected to the attenuation circuit 14. In the preferred embodiment, the attenuation circuit 14 is designed to accept up to a 600-volt AC RMS phase-to-phase input. Should the input voltage exceed the specified maximum voltage, the attenuation circuit 14 includes a protection circuit that protects the power meter 10 from damage. Those skilled in the art will recognize that a similar arrangement may be used for DC voltages or AC voltages other than the 600 volts range.

The input voltage and the input-current voltage of corresponding phases are multiplied and summed to calculate the instantaneous power. By performing the calculation in this manner, rather than using the power output of a Hall device, the power consumption becomes independent of the frequency limitation of the Hall Effect current sensor 12. The power consumption on higher frequency loads can thus be measured with accuracy. The multiplication of the input-current voltage and the input voltage occurs in a multiplier 18. For the three-phase embodiment illustrated in FIG. 1, the power meter 10 includes three multipliers 18a–18c, each corresponding to a single phase. Each of the three multipliers 18a–18c combines one phase-matched pair of the input voltage and the corresponding input-current voltage. The product of the two voltages is an AC signal at twice the supply frequency that is proportional to the instantaneous power in that phase. When multiple phases are involved, the output voltages of the multipliers are summed by the adder 20 to produce a voltage representing the total instantaneous power for all phases. If the phases are balanced in the system, the total instantaneous power is a perfect DC voltage. However, any unbalance in the phases results in the total instantaneous power having an AC component. The AC component does not register on a typical voltmeter but will register on a fast bar graph or a fast data acquisition system. It is well known in the art to use filters to remove the unwanted AC component from a DC signal. By monitoring the input frequency and controlling the filtering, the power meter 10 is capable of measuring power under all conditions. In addition, it can provide valuable information about load imbalance, which is carried by the power signal. Those skilled in the art will recognize that the adder 20 is not necessary for single phase or DC applications. A calibration amplifier 22 adjusts the output voltage of the adder 20 such that the output voltage is ten volts (10 V) at full scale. Finally, a precision isolation amplifier 24 isolates the adder output from the display and output portion of the power meter 10 from the high power portion of power meter 10. In the preferred embodiment, the isolation amplifier 24 provides a barrier having excellent high frequency transient immunity. The barrier characteristics therefore do not affect the signal integrity. The output voltage of the isolation amplifier 24 represents the total instantaneous power consumption of the attached load 11 and feeds the display and output portion of the power meter 10.

The total instantaneous power consumption voltage, or total power voltage, is used to provide the operator with information regarding the power usage of the load 11. In the illustrated embodiment, the power meter 10 includes an optional noise filter 26 for reducing noise in the total power voltage resulting from external sources such as load or supply line noise. In the preferred embodiment, the noise filter 26 is a lowpass filter having an adjustable time constant. Those skilled in the art will recognize that the noise filter time constant can be controlled either directly by a switch or remotely by an external device without interfering with the objects and advantages of the present invention. When remote monitoring is enabled, the filter response switch supplied on the power meter 10 is disabled. Fed either directly by the isolation amplifier 24 or the optional noise filter 26, an operator-adjustable main amplifier 28 calibrates the full scale output for display. A conversion unit 30 digitizes the analog input and converts the digital representation to the units selected by the operator, e.g., horsepower (HP) or kilowatts (KW) for display on a visual indicator 32, such as a numeric LED display 32. In the illustrated embodiment, the conversion unit 30 includes an analog-to-digital converter. The preferred embodiment contains a 32-digit or a 42-digit, 7-segment LED display. The peak value of the digital representation of the total power is sampled and held by a peak detector 34. In the preferred embodiment, the peak detector 34 obtains the peak value over a time period controlled by the operator, for example, by pressing and holding a button 70. If desired, the idle power can be subtracted from the total power. The peak value is held and displayed on the LED display 32 for a predetermined period of time or until the operator cancels the peak value display, such as by pressing a reset button 72.

The power meter 10 also includes a trip point detector 36. In the preferred embodiment, the trip point detector 36 includes operator selectable high and low trip points. In the preferred embodiment, each trip point is handled by a relay which trips when the power reaches a predetermined threshold value, e.g., the power exceeds the selected high trip point or is below the selected low trip point to avoid motor burn-ups or idle power waste. Further, the preferred embodiment includes an operator selectable time delay requiring the power to remain above or below the predetermined threshold for an adjustable, predetermined period of time to prevent false triggers resulting from noise or other sources. Finally, the trip point detector 36 includes a set of potential-free contacts for connecting an external warning or control device. Those skilled in the art will recognize that the trip points and the time delays can be set directly on the power meter 10 or from a remote interface without interfering with the objects and advantages of the present invention.

The power meter 10 further includes a reference value comparator 35 which detects and holds an operator selected reference value, such as the idle power or the normal power in a process or an operation. The reference value is compared to the measured instantaneous power to produce a differential voltage output. A source switch 86 channels the operator selected input, either the differential voltage output or the measured instantaneous voltage, to the conversion unit 30.

The output of the isolation amplifier 24 also drives a scaling amplifier, alternately referred to as a range amplifier, 38 for enhancing the sensor range or sensitivity. In the preferred embodiment, the scaling amplifier 38 is an accurate instrumentation amplifier. The gain of the scaling amplifier 38 is controlled by the operator adjustable range selector 40. The actual range is equal to the sensor range divided by range factor selected using the range selector 40 thereby allowing measurement of power at less than or greater than full scale with the desired degree of precision. For example, a power meter 10 having a 100-kilowatt full scale sensor is capable of providing displaying precise measurements for a one kilowatt (1 KW) power output full scale by dividing the full scale sensor range by a range factor of 100. In the preferred embodiment, the range selector includes six (6) user selectable range factors: 2, 5, 10, 20, 50, and 100. Those skilled in the art will recognize that other range factors can be used without interfering with the objects and advantages of the present invention. In the preferred embodiment, the range selector 40 is a switch; however, those skilled in the art will recognize that the range selector can also be controlled remotely without interfering with the objects and advantages of the present invention. When remote monitoring is enabled, the range selector switch supplied on the power meter 10 is disabled. For rapid display response, the range-adjusted power is instantaneously displayed on a visual indicator 42, such as a LED bar display, as a percentage of the range scale selected by the operator, in the resolution of the selected LED bar display 42. In the preferred embodiment, the LED bar display 42 is a 50-LED bar. Those skilled in the art will recognize that other percentage increments and displays can be used without interfering with the objects and advantages of the present invention.

Various external outputs are provided to allow the power meter 10 to interface with external devices, such as for control applications. In the preferred embodiment, the power meter 10 includes a scaled external voltage output from the scaling amplifier 38. Additionally, the power meter 10 includes a current source 44 for converting the scaled voltage from the scaling amplifier 38 to a current for control applications. In the preferred embodiment, the current source 44 is a 4–20 milliamp transmitter. Finally, an unscaled external voltage output is available from the main amplifier 28 and an external differential voltage output is available from the reference power comparator 35. Those skilled in the art will recognize that the voltage outputs may be amplified and scaled to different values as need to drive LEDs or other displays and control devices without interfering with the objects and advantages of the present invention.

Figure 2:
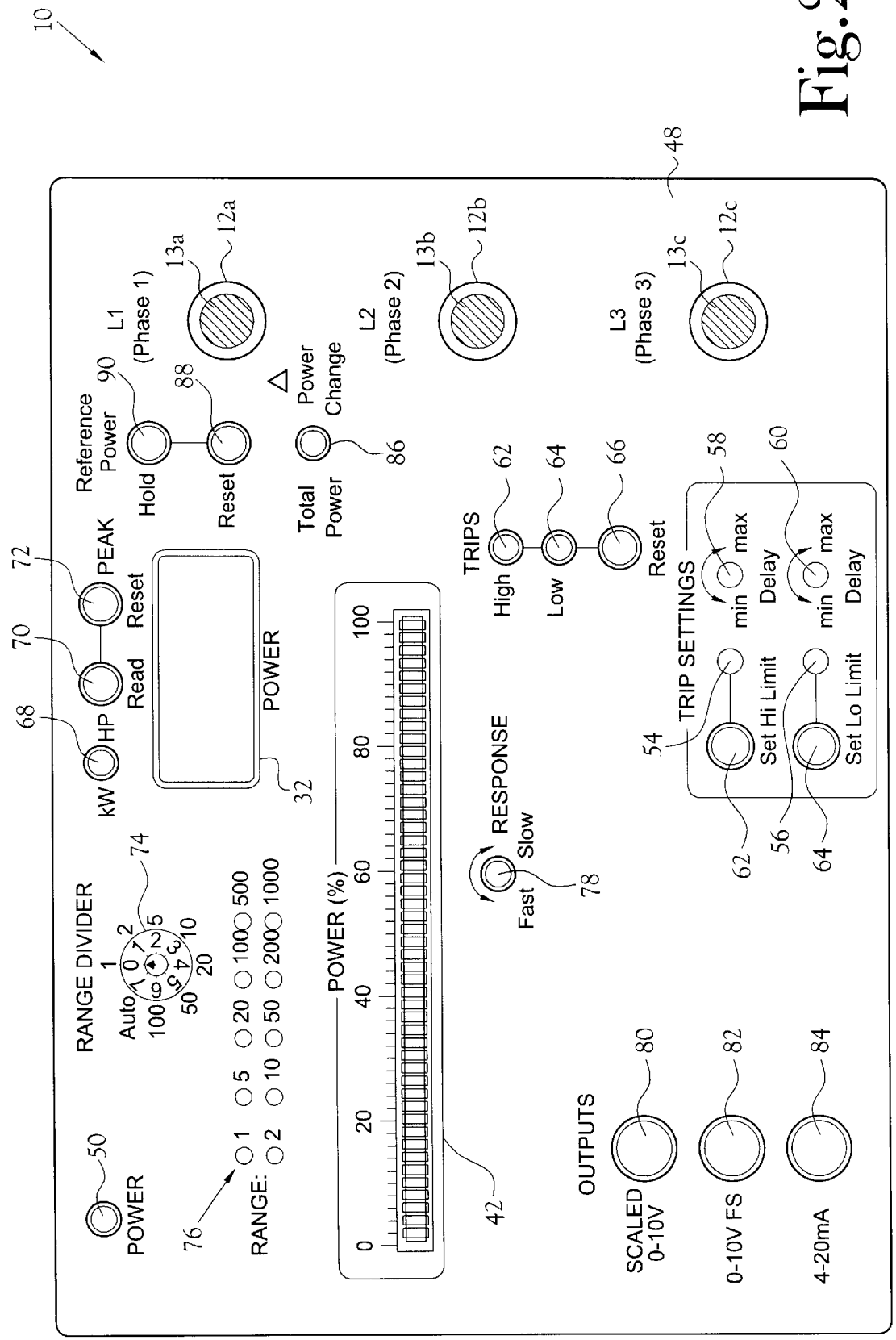
FIG. 2 is an illustration of the face of the power meter of FIG. 1 showing one embodiment of the operator interface.

FIG. 2 illustrates one embodiment of the face 48 of the power meter 10 showing the various features and displays available to the operator. In the illustrated embodiment, the power meter 10 is configured as a fixed meter associated with a single load 11. Accordingly, the Hall sensors 12a–12c are shown as through-openings in the power meter 10 through which current carrying conductors 13a–13c of the load 11 pass. Those skilled in the art will recognize that other configurations of sensors can be used without interfering with the objects and advantages of the prior art. For example, in a portable power meter 10, the Hall sensors are hinged probes connected to the power meter 10 via leads. Visible on the face 48 are visual indicators including the digital display 32 for displaying a numeric representation of the total power consumption and the peak power, the bar graph display 42 for graphically displaying a proportional representation of the instantaneous scaled total power consumption in relation to full scale, a power indicator 50 for indicating that the power meter 10 is operating, a high trip indicator 62 and a low trip indicator 64 for indicating that the total power reached the corresponding trip point, and a range indicator 76 for indicating the maximum value at full scale. Also visible are the various operator selectable adjustments including a high trip point selector 54 and a low trip point selector 56 for setting the corresponding trip points, a high trip delay selector 58 and a low trip delay selector 60 for setting the period for which the total power must exceed the trip point before a trip occurs, a measurement unit selector 68 for selecting whether the value displayed is in horsepower or kilowatts, a peak hold switch 70 which causes the power meter to store the peak value of the total power, a peak reset 72 for clearing the stored peak value, a reference power hold switch 90 which causes the power meter to store a current power measurement for comparison with a later power measurement, a reference power reset 88 for clearing the stored reference value, a source selection switch 86 for selecting whether the digital display 32 shows the instantaneous power or the differential power, a range divider selector 74 for selecting the appropriate divider by which to scale the total power output to improve the display precision, and a display response selector 78 to control the speed at which the bar graph display 42 is updated. Finally, the face 48 also displays a number of inputs and outputs. The illustrated embodiment, configured for use as a fixed position power meter for a three-phase load, includes a plurality of through-openings allowing the load conductors 13a–13c to pass through the internal Hall sensors 12a–12c. The face 48 also includes a high trip output 63 and a low trip output 65 for providing a control signal to an external device when a trip occurs. Next, the face 48 includes a scaled voltage output 80, an unscaled voltage output 82, and a control current output 84 for providing the power consumption information to an external device for monitoring or controlling a remote system. Those skilled in the art will recognize that other controls, inputs, and output can be used without interfering with the objects and advantages of the present invention.

An apparatus for measuring electrical power consumption has been disclosed having advantages over the prior art. The present invention does not require setting of the maximum input current and the maximum input voltage prior to making a measurement. Additionally, the present invention is capable of measuring the power consumption of a load requiring a high frequency power supply without degradation of the measurement accuracy. The power meter of the present invention provides a display of instantaneous power consumption as a percentage of the scaled measurement range. Further, the present invention provides a display of peak power consumption and operator selectable measurement units. The present invention also simultaneously provides both scaled and unscaled outputs, along with both high and low trip points. Finally, the power meter of the present invention is capable of communicating with and responding to external devices. In the preferred embodiment, the interface with external devices is a combination analog and digital interface providing bidirectional communication known to those skilled in the art.

While a preferred embodiment has been shown and described, it will be understood that it is not intended to limit the disclosure, but rather it is intended to cover all modifications and alternate methods falling within the spirit and the scope of the invention as defined in the appended claims. Those skilled in the art will recognize that the various features of the present invention previously described can be selectively grouped in different embodiments of the invention without departing from the spirit and the scope of the invention. Further, those skilled in the art will recognize that the various features, such as the filters, trip point sensors, and peak detectors, can be placed at various points in the invention to fulfill specific output needs without departing from the spirit and the scope of the invention.

Having thus described the aforementioned invention, we claim:

1. A power meter for measuring power consumption of an electrical load connected to a power supply line, said power meter comprising:
    at least one current sensor for producing a first voltage proportional to a magnetic field generated by a current conducted in the power supply line connected to the electrical load;
    at least one voltage attenuation circuit for producing a second voltage proportional to a voltage on the power supply line connected to the electrical load;
    at least one multiplier in electrical communication with said at least one current sensor and said at least one voltage attenuation circuit, said at least one multiplier multiplying said first voltage by said second voltage to produce a phase power voltage proportional to an instantaneous amount of power consumed by the electrical load;
    an adder in electrical communication with said at least one multiplier, said adder summing all said phase power voltages to produce a total power voltage;
    an analog-to-digital converter in electrical communication with said adder, said analog-to-digital converter converting said total power voltage to an output signal;
    at least one display in electrical communication with said analog-to-digital converter, said at least one display displaying at least said output signal in a human readable format; and
    a power supply for supplying power to said meter.

2. The power meter of claim 1 further comprising a unit converter in electrical communication between said analog-to-digital converter and said at least one display, said unit converter scaling said output signal to a predetermined unit of measurement.

3. The power meter of claim 1 further comprising at least one interface in electrical communication with said adder for communicating with an external device.

4. The power meter of claim 3 wherein said at least one interface is selected from the group consisting of, but not limited to, a scaled voltage output, an unscaled voltage output, a differential voltage output, a current output, a trip indicator output, and a control input.

5. The power meter of claim 4 wherein said at least one interface simultaneously includes said scaled voltage output and said unscaled voltage output.

6. The power meter of claim 1 wherein said at least one current sensor is a Hall Effect sensor.

7. A power meter for measuring power consumption of an electrical load connected to a power supply line, said power meter comprising:
    at least one means for measuring a current and producing a first voltage corresponding to the current conducted in the power supply line connected to the electrical load;
    at least one means for measuring a supply voltage on the power supply line connected to the electrical load and producing a second voltage corresponding to the supply voltage;
    means for calculating an analog total power voltage from all said first voltages and all said second voltages;
    means for generating a digital output signal from said means for calculating a total power voltage; and
    means for displaying said digital output signal in a human readable format.

8. The power meter of claim 7 wherein said means for displaying said output signal graphically displays said scaled voltage proportionally with respect to a full scale of a selected range.

9. The power meter of claim 7 further comprising a means for digitizing said total power voltage.

10. The power meter of claim 7 further comprising a means for scaling said output signal to a predetermined unit of measurement.

11. The power meter of claim 7 further comprising at least one means for communicating with an external device.

12. The power meter of claim 11 wherein said at least one means for communicating with an external device is selected from the group consisting of, but not limited to, a scaled voltage output, an unscaled voltage output, a differential voltage output, a current output, a trip indicator output, and a control input.

13. The power meter of claim 12 wherein said at least one means for communicating with an external device simultaneously includes said scaled voltage output and said unscaled voltage output.

14. The power meter of claim 7 further comprising
a means for storing a reference value of said output signal; and
a means for producing a differential voltage representative of a voltage differential between an instantaneous said output signal and said reference value.

15. The power meter of claim 14 further comprising a means for scaling said differential voltage to a selected range as a scaled voltage.

16. The power meter of claim 14 further comprising a means for selectively displaying either of said output signal and said differential voltage.

17. A power meter for measuring power consumption of an electrical load connected to a power supply line, said power meter comprising:
   at least one current sensor for producing a first voltage proportional to a magnetic field generated by a current conducted in the power supply line connected to the electrical load;
   at least one voltage attenuation circuit for producing a second voltage proportional to a voltage on the power supply line connected to the electrical load;
   at least one multiplier in electrical communication with said at least one current sensor and said at least one voltage attenuation circuit, said at least one multiplier multiplying said first voltage by said second voltage to produce a phase power voltage proportional to an instantaneous amount of power consumed by the electrical load;
   an adder in electrical communication with said at least one multiplier, said adder summing all said phase power voltages to produce a total power voltage;
   a reference value comparator in electrical communication with said adder, said reference value comparator storing a reference value of said total power voltage and producing a differential voltage representative of a voltage differential between an instantaneous said output signal and said reference value;
   a range amplifier in electrical communication with said adder and said reference value comparator, said range amplifier producing a scaled voltage equal to either of said total power voltage and said differential voltage scaled to a selected range;
   a first display in electrical communication with said range amplifier, said first display displaying said scaled voltage proportionally with respect to a full scale of said selected range;
   an analog-to-digital converter in electrical communication with said adder, said analog-to-digital converter converting said total power voltage to an output signal;
   a peak detector in electrical communication with said analog-to-digital converter, said peak detector storing a maximum value of said output signal;
   a source switch in electrical communication with said analog-to-digital converter for selectively displaying either of said output signal and said differential voltage;
   a unit converter in electrical communication with analog-to-digital converter, said unit converter scaling said output signal to a predetermined unit of measurement;
   a second display in electrical communication with said analog-to-digital converter, said second display displaying either of said output signal and said output signal maximum value in numeric format;
   a high trip point detector in electrical communication with said adder;
   a low trip point detector in electrical communication with said adder;
   at least one adjustable delay in electrical communication with said high trip point detector and said low trip point detector, said at least one adjustable delay setting a length of time such that said high trip point detector and said low trip point detector provide an indication only when said total power voltage remains beyond a corresponding threshold value for a selected said length of time;
   a plurality of output ports, each of said plurality of output ports in communication with one of said adder, said trip detector, and said range amplifier; and
   a power supply for supplying power to said meter.

18. The power meter of claim 17 further comprising at least one interface in electrical communication with either of said adder and said range amplifier, said at least one interface providing digital bidirectional communication with an external device.

19. The power meter of claim 17 wherein said plurality of outputs includes a scaled voltage output and an unscaled voltage output.

20. A power meter for measuring power consumption of an electrical load connected to a power supply line, said power meter comprising:
   at least one means for measuring a current and producing a first voltage corresponding to the current conducted in the power supply line connected to the electrical load;
   at least one means for measuring a supply voltage on the power supply line connected to the electrical load and producing a second voltage corresponding to the supply voltage;
   means for calculating a total power voltage from all said first voltages and all said second voltages;
   means for storing a reference value of said total power voltage and for producing a differential voltage representative of a voltage differential between an instantaneous said total power voltage and said reference value;
   means for selectively passing either of said total power voltage and said differential voltage as a source signal;
   means for digitizing said source signal as a digital output signal;
   means for scaling said digital output signal to a predetermined unit of measurement;
   means for scaling either of said source signal and said digital output signal to a selected range as a scaled voltage;
   means for graphically displaying said scaled voltage proportionally with respect to a full scale of said selected range;
   means for storing a maximum value of said digital output signal;
   means for displaying at least digital output signal in a numeric format;
   at least one means for determining when either of said source signal and said digital output signal remains beyond either of a high threshold value and a low threshold value for a selected period of time; and
   a plurality of means for communicating with an external device, each of said plurality of communication means in communication with one of said calculation means, said trip point detection means, and said scaling means.

21. The power meter of claim 20 wherein said plurality of communication means includes at least one means for providing digital bidirectional communication with an external device.

22. The power meter of claim 20 wherein said plurality of communication means includes a scaled voltage output and an unsealed voltage output.

23. A power meter for measuring power consumption of an electrical load connected to a power supply line, said power meter comprising:
- at least one current sensor for producing a first voltage proportional to a magnetic field generated by a current conducted in the power supply line connected to the electrical load;
- at least one voltage attenuation circuit for producing a second voltage proportional to a voltage on the power supply line connected to the electrical load;
- at least one multiplier in electrical communication with said at least one current sensor and said at least one voltage attenuation circuit, said at least one multiplier multiplying said first voltage by said second voltage to produce a phase power voltage proportional to an instantaneous amount of power consumed by the electrical load;
- an adder in electrical communication with said at least one multiplier, said adder summing all said phase power voltages to produce a total power voltage;
- an analog-to-digital converter in electrical communication with said adder, said analog-to-digital converter converting said total power voltage to an output signal;
- at least one display in electrical communication with said analog-to-digital converter, said at least one display displaying at least said output signal in a human readable format;
- a range amplifier in electrical communication with said adder, said range amplifier scaling said total power voltage to a selected range as a scaled voltage; and
- a power supply for supplying power to said meter.

24. The power meter of claim 23 further comprising a visual indicator in electrical communication with said range amplifier, said visual indicator displaying said scaled voltage proportionally with respect to a full scale of said selected range.

25. A power meter for measuring power consumption of an electrical load connected to a power supply line, said power meter comprising:
- at least one current sensor for producing a first voltage proportional to a magnetic field generated by a current conducted in the power supply line connected to the electrical load;
- at least one voltage attenuation circuit for producing a second voltage proportional to a voltage on the power supply line connected to the electrical load;
- at least one multiplier in electrical communication with said at least one current sensor and said at least one voltage attenuation circuit, said at least one multiplier multiplying said first voltage by said second voltage to produce a phase power voltage proportional to an instantaneous amount of power consumed by the electrical load;
- an adder in electrical communication with said at least one multiplier, said adder summing all said phase power voltages to produce a total power voltage;
- an analog-to-digital converter in electrical communication with said adder, said analog-to-digital converter converting said total power voltage to an output signal;
- at least one display in electrical communication with said analog-to-digital converter, said at least one display displaying at least said output signal in a human readable format;
- a peak detector in electrical communication between said analog-to-digital converter and said display, said peak detector storing a maximum value of said output signal; and
- a power supply for supplying power to said meter.

26. A power meter for measuring power consumption of an electrical load connected to a power supply line, said power meter comprising:
- at least one current sensor for producing a first voltage proportional to a magnetic field generated by a current conducted in the power supply line connected to the electrical load;
- at least one voltage attenuation circuit for producing a second voltage proportional to a voltage on the power supply line connected to the electrical load;
- at least one multiplier in electrical communication with said at least one current sensor and said at least one voltage attenuation circuit, said at least one multiplier multiplying said first voltage by said second voltage to produce a phase power voltage proportional to an instantaneous amount of power consumed by the electrical load;
- an adder in electrical communication with said at least one multiplier, said adder summing all said phase power voltages to produce a total power voltage;
- an analog-to-digital converter in electrical communication with said adder, said analog-to-digital converter converting said total power voltage to an output signal;
- at least one display in electrical communication with said analog-to-digital converter, said at least one display displaying at least said output signal in a human readable format;
- at least one trip point detector in electrical communication with said adder, said at least one trip point detector indicating when said total power voltage crosses either of a high threshold value and a low threshold value; and
- a power supply for supplying power to said meter.

27. The power meter of claim 26 wherein said at least one trip point detector includes an adjustable delay such that said at least one trip point detector provides an indication only when said total power voltage remains beyond either of a high threshold and a low threshold for a selected period of time.

28. A power meter for measuring power consumption of an electrical load connected to a power supply line, said power meter comprising:
- at least one current sensor for producing a first voltage proportional to a magnetic field generated by a current conducted in the power supply line connected to the electrical load;
- at least one voltage attenuation circuit for producing a second voltage proportional to a voltage on the power supply line connected to the electrical load;
- at least one multiplier in electrical communication with said at least one current sensor and said at least one voltage attenuation circuit, said at least one multiplier multiplying said first voltage by said second voltage to produce a phase power voltage proportional to an instantaneous amount of power consumed by the electrical load;
- an adder in electrical communication with said at least one multiplier, said adder summing all said phase power voltages to produce a total power voltage;
- an analog-to-digital converter in electrical communication with said adder, said analog-to-digital converter converting said total power voltage to an output signal;

at least one display in electrical communication with said analog-to-digital converter, said at least one display displaying at least said output signal in a human readable format;

a reference value comparator in electrical communication with said adder, said reference value comparator storing a reference value of said total power voltage and producing a differential voltage representative of a voltage differential between an instantaneous said output signal and said reference value; and a power supply for supplying power to said meter.

29. The power meter of claim 28 further comprising a range amplifier in electrical communication with said reference value comparator, said range amplifier scaling said differential voltage to a selected range as a scaled voltage.

30. The power meter of claim 28 further comprising a source switch in electrical communication with said analog-to-digital converter for selectively displaying either of said output signal and said differential voltage.

31. A power meter for measuring power consumption of an electrical load connected to a power supply line, said power meter comprising:

at least one means for measuring a current and producing a first voltage corresponding to the current conducted in the power supply line connected to the electrical load;

at least one means for measuring a supply voltage on the power supply line connected to the electrical load and producing a second voltage corresponding to the supply voltage;

means for calculating a total power voltage from all said first voltages and all said second voltages;

means for generating an output signal from said means for calculating a total power voltage;

means for displaying said output signal in a human readable format; and means for scaling said total power voltage to a selected range as a scaled voltage output.

32. A power meter for measuring power consumption of an electrical load connected to a power supply line, said power meter comprising:

at least one means for measuring a current and producing a first voltage corresponding to the current conducted in the power supply line connected to the electrical load;

at least one means for measuring a supply voltage on the power supply line connected to the electrical load and producing a second voltage corresponding to the supply voltage;

means for calculating a total power voltage from all said first voltages and all said second voltages;

means for generating an output signal from said means for calculating a total power voltage;

means for displaying said output signal in a human readable format; and at least one means for determining when said output signal crosses either of a high threshold and a low threshold.

33. A power meter for measuring power consumption of an electrical load connected to a power supply line, said power meter comprising:

at least one means for measuring a current and producing a first voltage corresponding to the current conducted in the power supply line connected to the electrical load;

at least one means for measuring a supply voltage on the power supply line connected to the electrical load and producing a second voltage corresponding to the supply voltage;

means for calculating a total power voltage from all said first voltages and all said second voltages;

means for generating an output signal from said means for calculating a total power voltage;

means for displaying said output signal in a human readable format; and at least one means for determining when said output signal crosses either of a high threshold value and a low threshold value.

34. The power meter of claim 33 wherein said at least one means for determining when said output signal crosses either of the high threshold value and the low threshold value includes a means for adjusting the response speed of said at least one determining means such that said at least one determining means provides an indication only when said total power voltage remains beyond either of the high threshold value and the low threshold value for a selected period of time.

* * * * *